United States Patent
Shishido et al.

(10) Patent No.: US 9,131,177 B2
(45) Date of Patent: Sep. 8, 2015

(54) SOLID-STATE IMAGING DEVICE AND IMAGE CAPTURING APPARATUS INCLUDING THE SAME

(71) Applicant: Panasonic Corporation, Osaka (JP)

(72) Inventors: Sanshiro Shishido, Osaka (JP); Yutaka Abe, Osaka (JP); Masahiro Higuchi, Hyogo (JP); Makoto Ikuma, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/293,169

(22) Filed: Jun. 2, 2014

(65) Prior Publication Data

US 2014/0267854 A1  Sep. 18, 2014

Related U.S. Application Data

(63) Continuation of application No. PCT/JP2012/007129, filed on Nov. 7, 2012.

(30) Foreign Application Priority Data

Dec. 9, 2011  (JP) .................................. 2011-269695

(51) Int. Cl.
*H04N 5/335*  (2011.01)
*H04N 5/3745*  (2011.01)
(Continued)

(52) U.S. Cl.
CPC ........ *H04N 5/3745* (2013.01); *H01L 27/14609* (2013.01); *H01L 27/14629* (2013.01); *H01L 27/14632* (2013.01); *H04N 5/357* (2013.01); *H04N 5/378* (2013.01)

(58) Field of Classification Search
CPC ..... H04N 5/357; H04N 5/3745; H04N 5/355; H04N 5/37455; H04N 5/378
See application file for complete search history.

(56) References Cited

U.S. PATENT DOCUMENTS 5,990,948 A * 11/1999 Sugiki ........................... 348/250
7,623,173 B2  11/2009 Nitta et al.
(Continued)

FOREIGN PATENT DOCUMENTS

JP  9-247497  9/1997
JP  3361005  1/2003
(Continued)

OTHER PUBLICATIONS

International Search Report issued Dec. 18, 2012 in corresponding International Application No. PCT/JP2012/007129.

*Primary Examiner* — Aung S Moe
*Assistant Examiner* — Amy Hsu
(74) *Attorney, Agent, or Firm* — Wenderoth, Lind & Ponack, L.L.P.

(57) ABSTRACT

A solid-state imaging device including: a plurality of pixels which are on a same semiconductor substrate and each of which generates a pixel signal; a comparison circuit that is connected to the pixels in each of columns; a D/A conversion circuit that generates a comparison potential and provide the generated comparison potential in common to the comparison circuit in each column; and a D/A conversion circuit output unit provided in a common line for providing the comparison potential to the comparison circuit in each column, wherein the D/A conversion circuit output unit includes: a source follower circuit that is provided to the line and includes a first current source having a transistor, and an amplification transistor having a gate oxide film that is thinner than a gate oxide film of the transistor; and a voltage control circuit that controls a drain-to-source voltage of the amplification transistor.

6 Claims, 9 Drawing Sheets

(51) Int. Cl.
 *H04N 5/378* (2011.01)
 *H01L 27/146* (2006.01)
 *H04N 5/357* (2011.01)

(56) References Cited

U.S. PATENT DOCUMENTS

| | | |
|---|---|---|
| 7,710,479 B2 | 5/2010 | Nitta et al. |
| 7,961,238 B2 | 6/2011 | Nitta et al. |
| 8,009,217 B2 | 8/2011 | Miyagawa |
| 8,063,966 B2 | 11/2011 | Shinohara |
| 8,174,422 B2 | 5/2012 | Okamoto et al. |
| 8,471,942 B2 | 6/2013 | Shinohara |
| 8,502,899 B2 | 8/2013 | Wakabayashi et al. |
| 8,553,122 B2 | 10/2013 | Nitta et al. |
| 2005/0195304 A1* | 9/2005 | Nitta et al. ............... 348/308 |
| 2009/0033759 A1 | 2/2009 | Wakabayashi |
| 2009/0190021 A1 | 7/2009 | Nitta et al. |
| 2009/0231478 A1* | 9/2009 | Shinohara ............... 348/300 |
| 2009/0290058 A1* | 11/2009 | Miyagawa ............... 348/308 |
| 2010/0245649 A1 | 9/2010 | Nitta et al. |
| 2010/0259430 A1* | 10/2010 | Okamoto et al. ......... 341/122 |
| 2011/0074994 A1* | 3/2011 | Wakabayashi et al. ...... 348/302 |
| 2011/0199526 A1 | 8/2011 | Nitta et al. |
| 2012/0092540 A1 | 4/2012 | Shinohara |
| 2013/0193949 A1 | 8/2013 | Wakabayashi |
| 2013/0293754 A1 | 11/2013 | Wakabayashi et al. |
| 2014/0016011 A1 | 1/2014 | Nitta et al. |

FOREIGN PATENT DOCUMENTS

| | | |
|---|---|---|
| JP | 2008-124229 | 5/2008 |
| JP | 4107269 | 6/2008 |
| JP | 2009-38772 | 2/2009 |
| JP | 2009-225004 | 10/2009 |
| JP | 2009-283552 | 12/2009 |
| JP | 2009-296423 | 12/2009 |
| JP | 2010-251914 | 11/2010 |
| WO | 2009/148107 | 12/2009 |

\* cited by examiner

SOLID-STATE IMAGING DEVICE AND IMAGE CAPTURING APPARATUS INCLUDING THE SAME

CROSS REFERENCE TO RELATED APPLICATION

This is a continuation application of PCT Patent Application No. PCT/JP2012/007129 filed on Nov. 7, 2012, designating the United States of America, which is based on and claims priority of Japanese Patent Application No. 2011-269695 filed on Dec. 9, 2011. The entire disclosures of the above-identified applications, including the specifications, drawings and claims are incorporated herein by reference in their entirety.

FIELD

The present disclosure relates to a solid-state imaging device and an image capturing apparatus.

BACKGROUND

FIG. 10 illustrates a conventional solid-state imaging device disclosed by Patent Literature (PTL) 1.

Each of pixel blocks PB11, PB12, PB21, and PB22 includes a switch 101 and a light receiving element 102 that are connected in series between a power source 100 and a ground potential. An amplifier 103 has an input terminal connected to a connection point between the switch 101 and the light receiving element 102, and an output terminal connected to a signal lead line (a vertical line) VL1 or VL2 via a switch 104.

Signal lead lines VL1 to VLm are connected to noise cancel circuits NR1 to NRm, respectively. The signal lead line VL1 is connected to a connection point between one of electrodes of a capacitor 3-1 and one of electrodes of a capacitor 4-1 via a switch 2-1. The other of the electrodes of the capacitor 3-1 is connected to an output terminal of a D/A converter 311 via a switch 5-1.

Each of latch circuits 9-1 to 9-$m$ latches a count value of a counter 312 when an output of an inverter of each of the corresponding noise cancel circuits NR1 to NRm is inverted.

The output of the counter 312 is inputted to the D/A converter 311. The D/A converter 311 is shared among the noise cancel circuits NR1 to NRm. The counter 312 is reset upon receiving a horizontal synchronization signal HD, and counts a clock. The horizontal synchronization signal and the clock are provided to a timing generator 313. The timing generator 313 generates a timing signal for various types of switch control or the like.

Latch circuits 104 to 10-$m$ are disposed corresponding to the latch circuits 9-1 to 9-$m$ of a control unit, and simultaneously latch digital values latched by the corresponding latch circuits 9-1 to 9-$m$, with timing of a horizontal synchronization signal. The latch circuits 10-1 to 10-$m$ have output terminals respectively connected to scanning switches 6-1 to 6-$m$. These scanning switches 6-1 to 6-$m$ turn ON in sequence during one horizontal scanning period, to lead to an output line 70 digital values of image signals for one scanning.

As stated above, the conventional solid-state imaging device has an A/D conversion circuit in each column, converts a pixel output signal that is an analog signal into a digital signal, and outputs the digital signal.

CITATION LIST

Patent Literature

[PTL 1] Japanese Unexamined Patent Application Publication No. H09-247497

SUMMARY

Technical Problem

Unfortunately, the conventional solid-state imaging device disclosed by PTL 1 has a problem that horizontally linear random noise is generated in image data due to the occurrence of a random fluctuation in a comparison potential generated by the D/A conversion circuit, which degrades image quality. In other words, the noise generated in the D/A conversion circuit causes uniform errors in results of digital conversion performed for all columns with the same timing.

The errors thus generated appear as the horizontally linear random noise in an image obtained from an output signal from the solid-state imaging device. As a result, the image quality is degraded significantly.

In view of the above problem, one non-limiting and exemplary embodiment provides a solid-state imaging device capable of reducing the horizontally linear random noise.

Solution to Problem

One non-limiting and exemplary embodiment provides a solid-state imaging device including: a plurality of pixels which are arranged in rows and columns on a same semiconductor substrate and each of which generates a pixel signal according to an amount of received light; a comparison circuit that is connected in common to the pixels in each of the columns and compares the pixel signal to a comparison signal that is a comparison criterion; a comparison signal generating unit configured to generate the comparison signal and provide the comparison signal in common to the comparison circuit in each column; and a signal conditioning circuit provided in a common signal path for providing the comparison signal from the comparison signal generating unit to the comparison circuit in each column, wherein the signal conditioning circuit includes: a source follower circuit that is provided to the signal path and includes a first current source having a transistor, and an amplification transistor having a gate oxide film that is thinner than a gate oxide film of the transistor; and a voltage control circuit that controls a drain-to-source voltage of the amplification transistor.

As above, by making the film thickness of the gate oxide film of the amplification transistor less than that of the gate oxide film of the transistor of the first current source, it is possible to reduce random noise generated in the source follower circuit. Thus, it is possible to reduce the random noise of a comparison signal inputted to the comparison circuit in each column. As a result, it is possible to reduce noise that results from the random noise of the comparison signal and causes uniform errors in the results of digital conversion performed for all the columns.

In other words, the solid-state imaging device is capable of reducing the random noise that appears as horizontal lines in an image obtained from an output signal outputted from the solid-state imaging device.

Moreover, the voltage control circuit may be inserted between a drain terminal of the amplification transistor and a power source, and control the drain-to-source voltage of the amplification transistor by controlling a drain voltage of the amplification transistor so that a gate-to-drain voltage of the amplification transistor is a predetermined voltage.

With this, the drain-to-source voltage of the amplification transistor is a constant potential difference. Thus, it is possible to suppress linear degradation associated with a channel length modulation effect of the amplification transistor in input-output characteristics of the signal conditioning circuit.

Furthermore, the predetermined voltage may be less than or equal to a withstand voltage of the gate-to-drain voltage of the amplification transistor.

With this, it is possible to prevent gate oxide breakdown and drain/source junction damage of the amplification transistor.

Moreover, the voltage control circuit may include: a voltage regulating transistor inserted between a drain terminal of the amplification transistor and a power source; and an operational amplifier having one of input terminals connected to a gate terminal of the amplification transistor, the other of the input terminals connected to the drain terminal of the amplification transistor, and an output terminal connected to a gate terminal of the voltage regulating transistor.

As above, by configuring the voltage control circuit with a feedback circuit, the gate voltage of the amplification transistor is equal to the drain voltage of the same. Thus, it is possible to enhance linearity of the input-output characteristics of the signal conditioning circuit.

With this, when an image is generated by converting an amount of light into digital signals with reference to the comparison signal outputted from the D/A conversion circuit, it is possible to reduce image characteristic degradation such as a standout of an image of a subject captured in the dark and gamma characteristic degradation which is caused by non-linearity of the signal conditioning circuit.

Furthermore, the voltage control circuit may include: a voltage control transistor having a gate terminal connected to a gate terminal of the amplification transistor, and a source terminal connected to a drain terminal of the amplification transistor; and a second current source that is a current source of the voltage control transistor.

With this, for example, if the second current source includes a transistor, it is possible to reduce the random noise that appears the horizontal lines, and achieve a miniaturized solid-state imaging device.

Moreover, an image capturing apparatus according to an aspect of the present disclosure includes the above solid-state imaging device.

Advantageous Effects

The present disclosure provides a solid-state imaging device capable of reducing horizontally linear random noise.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

The following describes in detail embodiments and modifications with reference to the drawings.

Each of the embodiments and modifications described below shows a general or specific example. The numerical values, shapes, structural elements, the arrangement and connection of the structural elements etc. shown in the following embodiments are mere examples, and therefore do not limit the scope of the present disclosure. Therefore, among the structural elements in the following embodiments and modifications, structural elements not recited in any one of the independent claims are described as arbitrary structural elements.

Embodiment 1

Figure 1:
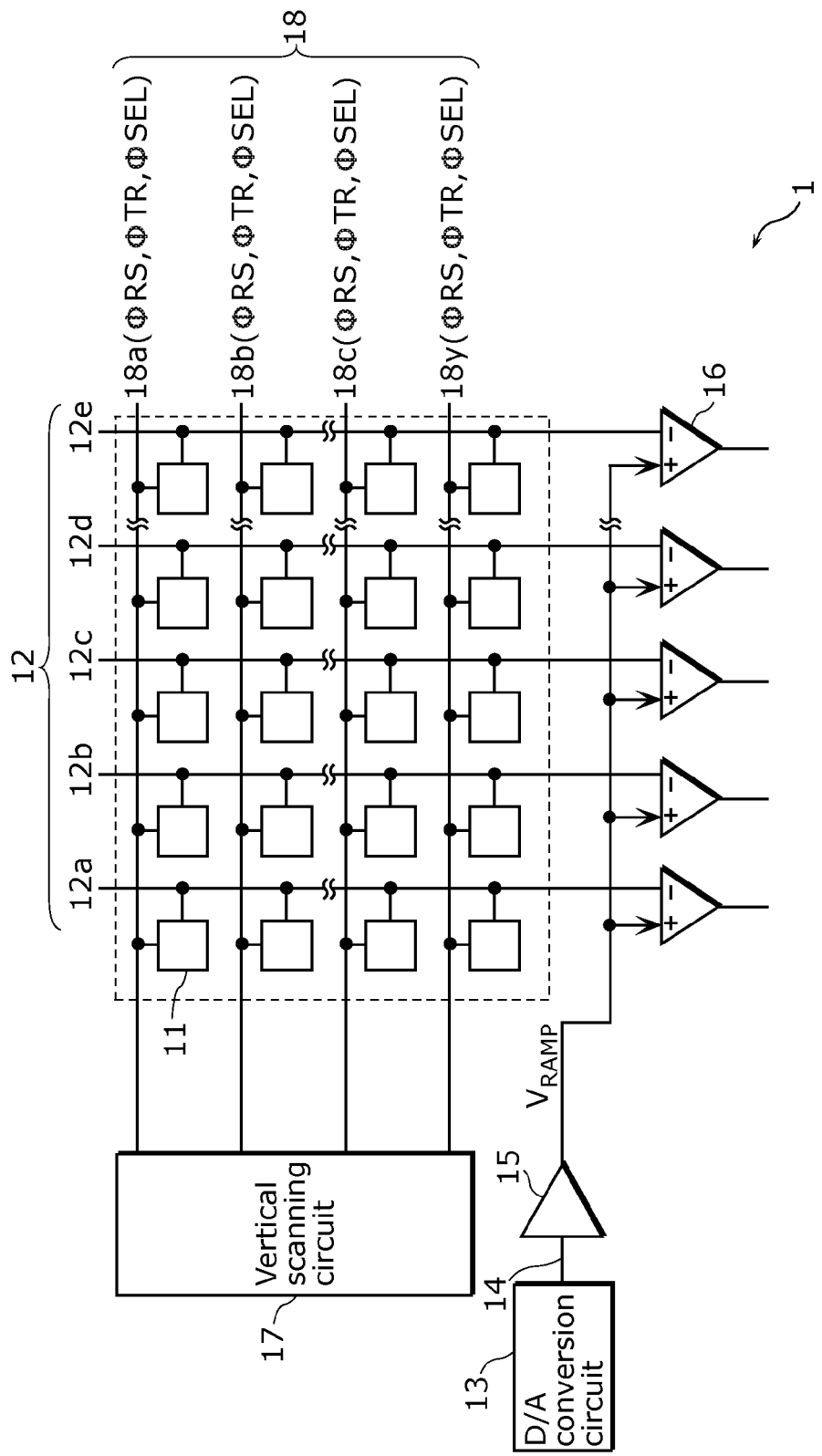
FIG. 1 is a schematic circuit diagram illustrating a whole configuration of a solid-state imaging device according to Embodiment 1.
Figure 2:
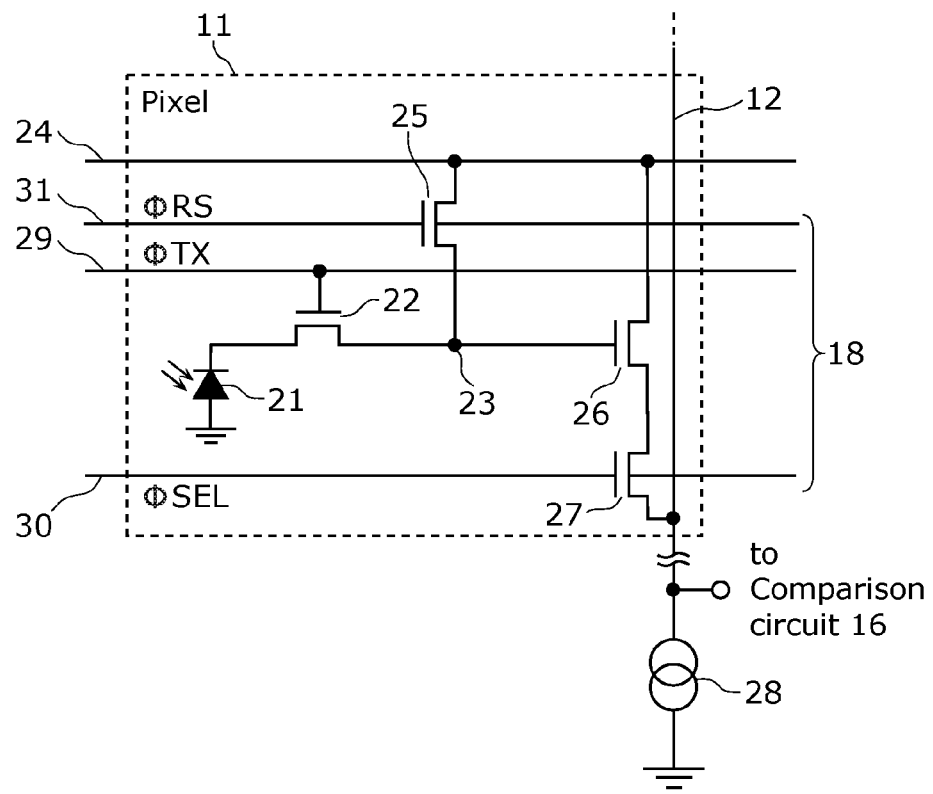
FIG. 2 is a circuit diagram illustrating a detailed configuration of a pixel.

FIG. 1 is a schematic circuit diagram illustrating a whole configuration of a solid-state imaging device according to Embodiment 1, and FIG. 2 is a circuit diagram illustrating a detailed configuration of a pixel.

First, as illustrated in FIG. 1, a solid-state imaging device 1 according to this embodiment includes: pixels 11 that are of a column parallel A/D conversion type and arranged in rows and columns; a vertical signal line 12 (12a, 12b, 12c, 12d, 12e) connected to the pixels 11 in each column; a D/A conversion circuit 13 that is a comparison potential generation circuit; a D/A conversion circuit output unit 15 connected to the D/A conversion circuit 13 via a line 14; a comparison circuit 16 connected to the D/A conversion circuit output unit 15 and the vertical signal line 12 in each column; and a vertical scanning circuit 17 that controls row addresses and row scanning.

As illustrated in FIG. 2, each of the pixels 11 includes: a photo diode 21 that is a photoelectric conversion element (pixel, light receiving unit); a transfer transistor 22; a floating diffusion (FD) unit 23; a reset transistor 25 connected between the FD unit 23 and a power source signal line 24; an amplification transistor 26; and a selection transistor 27. The pixels 11 belonging to the same column are connected to the vertical signal line 12 and a column current source load 28 that is a load of the amplification transistor 26.

The vertical signal line 12 is grounded via the column current source load 28. When one of the pixels 11 is selected (a signal is read), the vertical signal line 12, the amplification transistor 26, and the column current source load 28 constitute a source follower circuit. When the signal is read, an output of the amplification transistor 26 is provided to the comparison circuit 16.

The output of the amplification transistor 26 is provided to one of input terminals of the comparison circuit 16, and the D/A conversion circuit output unit 15, the comparison potential generation circuit connected in common to the columns, is connected to the other of the input terminals of the comparison circuit 16.

Each pixel 11 is connected to a horizontal signal line 18, such as the power source signal line 24, a transfer signal line 29, a selection signal line 30, and a reset signal line 31, controlled by the vertical scanning circuit 17.

In FIG. 1 and FIG. 2, the photo diode 21 converts, into a signal charge, light incident on the solid-state imaging device 1. The transfer transistor 22 transfers, to the FD unit 23, the signal charge generated by the photo diode 21, according to a transfer pulse φTX transmitted via the transfer signal line 29, and the FD unit 23 temporarily accumulates the signal charge. Then, the signal charge of the pixel 11 selected by the selection transistor 27 according to a selection pulse φSEL transmitted via the selection signal line 30 is converted into a voltage, and the voltage is outputted to the comparison circuit 16 via the vertical signal line 12. Hereinafter, the voltage into which the signal charge is converted may be referred to as a pixel signal.

The comparison circuit 16 compares a potential of each of pixel signals in respective columns to a comparison potential $V_{RAMP}$ outputted from the D/A conversion circuit 13. When the potential and the comparison potential $V_{RAMP}$ change their places in a magnitude relationship, a polarity of an output of the comparison circuit 16 is inverted. A period of time t from a start time of applying the comparison potential $V_{RAMP}$ to a time when the comparison circuit output is inverted indicates the potential of the pixel signal. Thus, it is possible to obtain a digital value of the pixel signal by, for instance, measuring the period of time t using a counter.

As stated above, the solid-state imaging device 1 according to this embodiment includes: the pixels 11 arranged in rows and columns; the comparison circuit 16 connected in common to the pixels 11 in each column; the D/A conversion circuit 13 that generates a comparison potential $V_{RAMP}$ for a comparison operation performed by the comparison circuit 16 and provides the comparison potential $V_{RAMP}$ in common to the comparison circuit 16 in each column; and the D/A conversion circuit output unit 15 provided in the common line 14 for providing the comparison potential $V_{RAMP}$ to the comparison circuit 16 in each column from the D/A conversion circuit 13.

Figure 3:
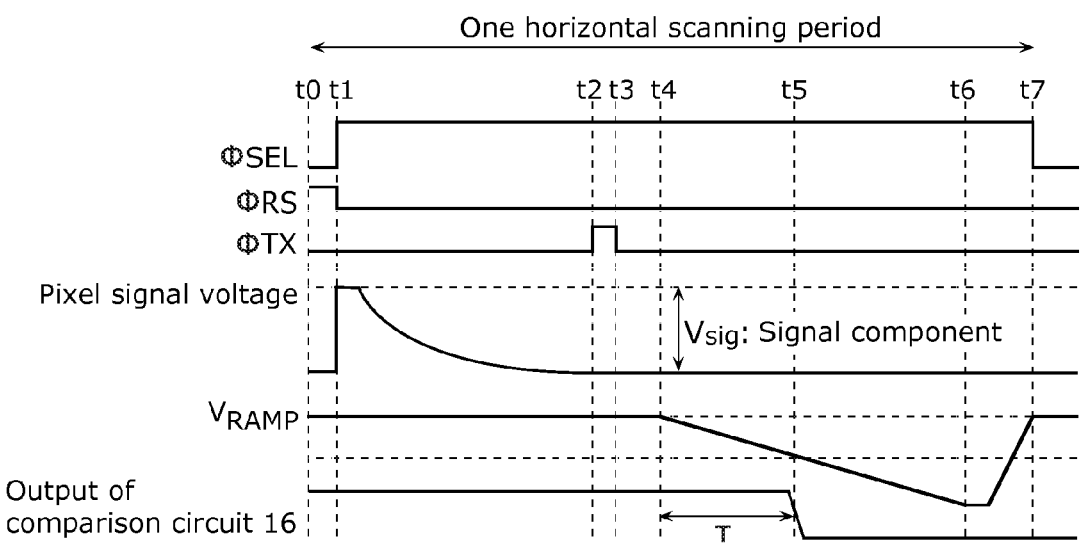
FIG. 3 is a timing chart illustrating operations of a solid-state imaging device.

Next, the following describes the details of operations of the solid-state imaging device 1 according to this embodiment with reference to FIG. 3.

FIG. 3 is a timing chart illustrating operations of the solid-state imaging device 1 according to this embodiment. It is to be noted that in the figure the horizontal axis represents a time, and the vertical axis represents a voltage of each signal. A reset pulse φRS transmitted via the reset signal line 31 represents a pulse signal for controlling the reset transistors 25 in common in a predetermined row. A transfer pulse φTX represents a pulse signal for controlling the transfer transistors 22 in common in a predetermined row. A selection pulse φSEL represents a pulse signal for controlling the selection transistors 27 in common in a predetermined row. A potential Vsig represents a potential of the vertical signal line 12 connected to the pixels 11.

First, at time t0, a potential of the selection pulse φSEL is set at an "L" level, and a potential of the reset pulse φRS is set at an "H" level. At this time, the transfer pulse φTX is at the "L" level, and the photo diode 21 and the FD unit 23 are electrically blocked. In this situation, the selection transistor 27 is in the OFF state, and an output of the amplification transistor 26 is not read into the vertical signal line 12. Moreover, the reset transistor 25 is in the ON state, and a potential of the FD unit 23 is set at a reset level.

Next, at time t1, the potential of the selection pulse φSEL changes to the "H" level, and the potential of the reset pulse φRS changes to the "L" level. In this situation, the reset transistor 25 switches to the OFF state, and the selection transistor 27 switches to the ON state. As a result, the amplification transistor 26 starts outputting the reset level to the vertical signal line 12.

Next, at time t2, the potential of the transfer pulse φTX changes to the "H" level, and the transfer transistor 22 switches to the ON state. As a result, a signal charge of the photo diode 21 is transferred to the FD unit 23. A potential of a gate of the amplification transistor 26 decreases by Vsig in proportion to an amount of light incident on a pixel, and a potential of the vertical signal line 12 decreases accordingly.

Next, at time t3, the potential of the transfer pulse φTX changes to the "L" level, and the transfer transistor 22 switches to the OFF state and ends the transfer of the signal charge of the photo diode 21.

Next, from time t4 to time t6, a comparison potential $V_{RAMP}$ outputted by the D/A conversion circuit 13 is gradually reduced. The comparison circuit 16 in each column compares each of pixel signals outputted to the vertical signal line 12 in each column to the comparison potential $V_{RAMP}$ outputted by the D/A conversion circuit 13 via the D/A conversion circuit output unit 15. The comparison circuit 16 compares the pixel signal in each column to the comparison potential $V_{RAMP}$ to determine a magnitude relationship, and a comparison circuit output of the comparison circuit 16 is inverted at the time t5 according to the magnitude relationship. In other words, a period of time t from when an application of the comparison potential $V_{RAMP}$ is started to when the output of the comparison circuit 16 is inverted is a value indicating the potential of the pixel signal obtained by each pixel performing photoelectric conversion.

Next, at time t7, the potential of the selection pulse φSEL changes to the "L" level, and the selection transistor 27 switches to the OFF state.

By sequentially performing the above operations on the pixels 11 in each row, the pixel signal of each of the pixels 11 arranged in an array in XY directions is outputted, and two-dimensional image data is generated. To put it another way, the solid-state imaging device 1 according to this embodiment compares the pixel signal that has an analog value and is outputted from each pixel 11, to the comparison potential $V_{RAMP}$. With this, the pixel signals having the analog values are converted into pixel signals having digital values, and the two-dimensional image data is generated using the converted pixel signals that have the digital values and correspond to the pixels 11.

Here, a problem is described which occurs if noise is superimposed on the comparison potential $V_{RAMP}$ to be inputted to the comparison circuit 16.

As stated above, since the pixel signal having the digital value corresponds to the period of time t from when reduction of the comparison potential $V_{RAMP}$ is started to when the output of the comparison circuit 16 is inverted, if the noise is superimposed on the comparison potential $V_{RAMP}$ to be inputted to the comparison circuit 16, the noise is superimposed in the period of time t until the output of the comparison circuit 16 is inverted. Thus, the noise is also superimposed on the pixel signal having the digital value.

In particular, if the noise is superimposed on such a comparison potential $V_{RAMP}$, the noise causes uniform errors in results of comparison by the comparison circuits 16 in all the columns performing the comparison operation with the same timing. As a result, horizontally linear noise is caused in the generated two-dimensional image data.

Since the human eye is sensitive to recognition of patterns in vertical and horizontal directions in image recognition, such horizontally linear noise significantly degrades image quality.

In view of this, the solid-state imaging device 1 according to this embodiment includes the D/A conversion circuit output unit 15 provided in the common line 14 for providing the comparison potential $V_{RAMP}$ from the D/A conversion circuit 13 to the comparison circuit 16 in each column. The D/A conversion circuit output unit 15 includes: a source follower circuit that is provided in the line 14 and includes a first current source having a transistor, and an amplification transistor having a gate oxide film thinner than a gate oxide film of the transistor of the first current source; and a voltage control circuit that controls a drain-to-source voltage of the amplification transistor.

With this, the noise in the comparison potential $V_{RAMP}$ to be inputted to the comparison circuit 16 can be suppressed, and thus the noise in the pixel signal having the digital value is suppressed. There, the horizontally linear random noise can be reduced to suppress the degradation of the image quality.

The following describes the details of the D/A conversion circuit output unit 15.

Figure 4:
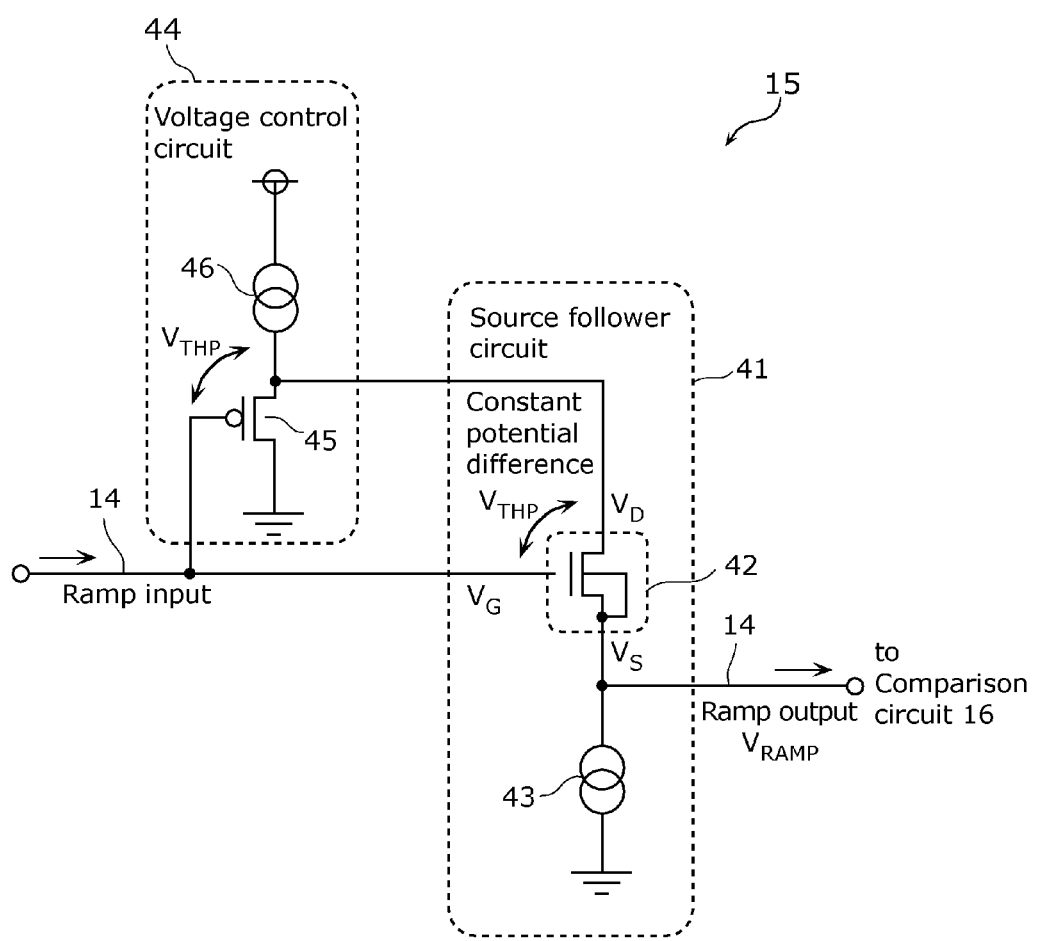
FIG. 4 is a circuit diagram illustrating a detailed configuration of a D/A conversion circuit output unit.

FIG. 4 is a circuit diagram illustrating a detailed configuration of the D/A conversion circuit output unit 15 of the solid-state imaging device 1 according to this embodiment.

As illustrated in FIG. 4, the D/A conversion circuit output unit 15 includes a source follower circuit 41 and a voltage control circuit 44.

The source follower circuit 41 includes, as a final stage buffer circuit that outputs the comparison potential $V_{RAMP}$, an amplification transistor 42 and a first current source 43, and outputs the comparison voltage $V_{RAMP}$. Specifically, the source follower circuit 41 includes: the amplification transistor 42 having a gate terminal connected to the D/A conversion circuit 13, a source terminal connected to the first current source 43, and a drain terminal connected to a power source via the voltage control circuit 44; and the first current source 43 that is a current source of the amplification transistor 42. The voltage control circuit 44 that outputs, to the comparison circuit 16, the comparison potential $V_{RAMP}$ inputted from the D/A conversion circuit 13 includes a voltage control transistor 45 and a second current source 46, and maintains a gate-to-drain voltage $V_{GD}$ of the amplification transistor 42 at a constant potential difference. More specifically, the voltage control circuit 44 includes: the voltage control transistor 45 having a gate terminal connected to the gate terminal of the amplification transistor 42 and a source terminal connected to the drain terminal of the amplification transistor 42; and the second current source 46 that is a current source of the voltage control transistor 45. As above, the voltage control transistor 45 and the second current source 46 constitute the source follower circuit.

Here, the amplification transistor 42 has a structure in which a gate oxide film is thinner than gate oxide films of other transistors. (Hereinafter, a transistor having this structure is referred to as a thin-film transistor.) The details of a configuration of the thin-film transistor are described later.

Figure 5:
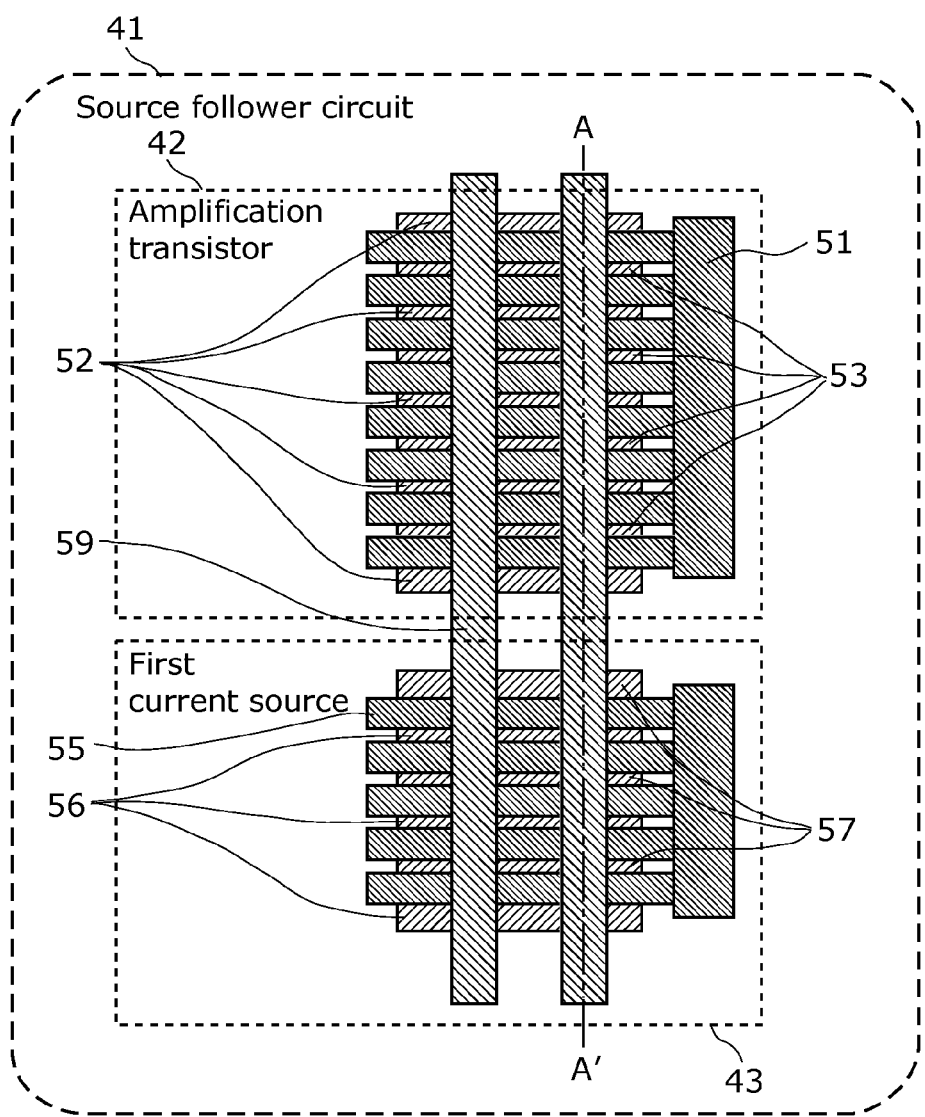
FIG. 5 is a top view illustrating a configuration of a source follower circuit.

FIG. 5 is a top view illustrating a configuration of the source follower circuit 41 according to this embodiment.

As illustrated in FIG. 5, the amplification transistor 42 including a gate electrode 51, a source portion 52, and a drain portion 53 is connected to the first current source 43 including a gate electrode 55, a source portion 56, and a drain portion 57 via a metal line 59, and the amplification transistor 42 and the first current source 43 constitute the source follower circuit 41.

Figure 6:
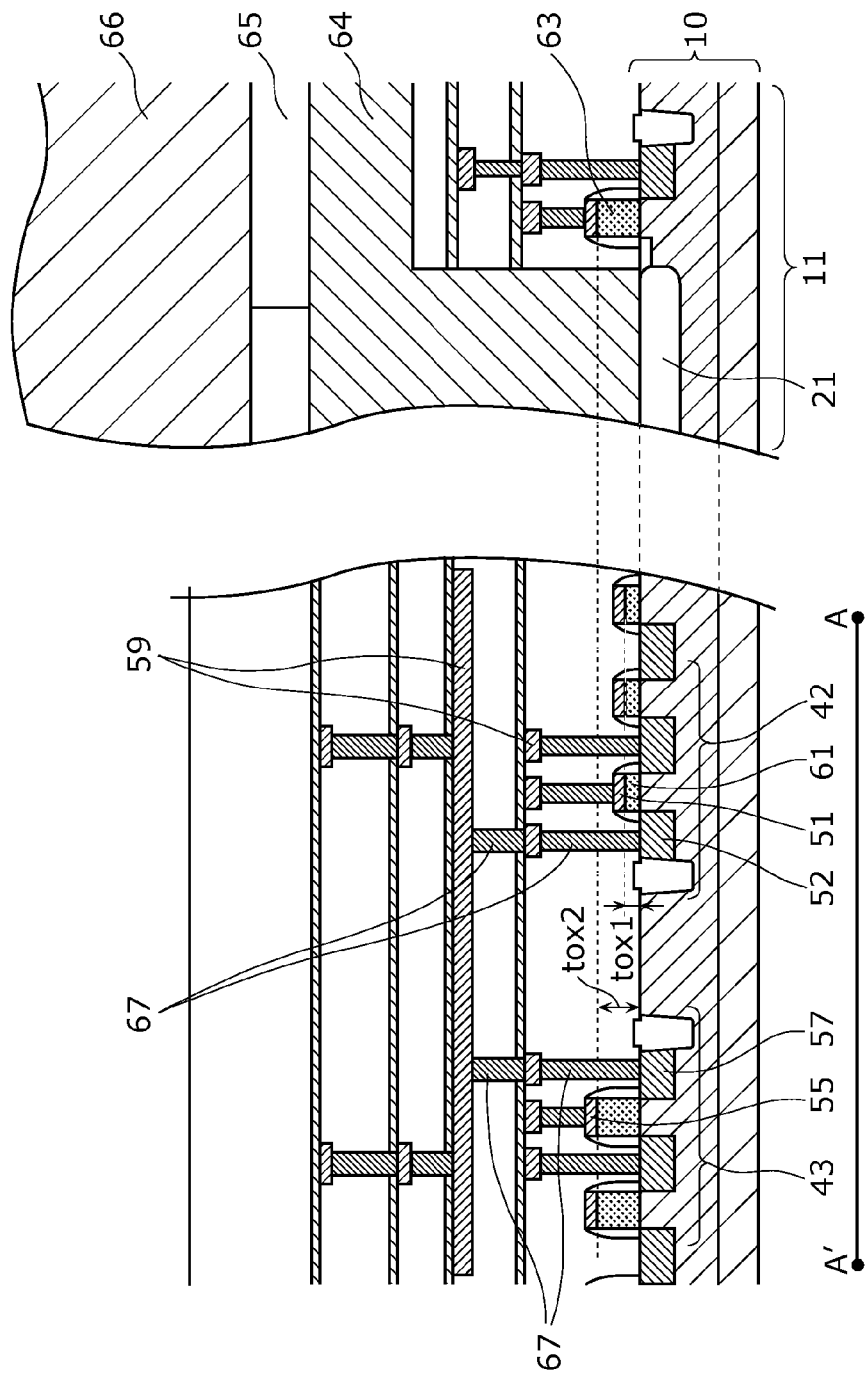
FIG. 6 is a cross sectional view illustrating a structure on section A-A' of FIG. 5 and a structure of a pixel.

FIG. 6 is a cross sectional view illustrating a structure on section A-A' of FIG. 5 and a structure of the pixel 11.

As illustrated in FIG. 6, the pixel 11 includes the photo diode 21 on a semiconductor substrate 10. It is to be noted that a transistor 63 is one of the transfer transistor 22, the reset transistor 25, the amplification transistor 26, and the selection transistor 27. A waveguide 64 for guiding incident light is on the photo diode 21, a color filter 65 is on the waveguide 64, and an on-chip microlens 66 is on the color filter 65.

Moreover, as illustrated in FIG. 6, the amplification transistor 42 and the first current source 43 are on the same semiconductor substrate 10 as included in the pixel 11, and constitute the source follower circuit 41 included in the D/A conversion circuit output unit 15. Specifically, the amplification transistor 42 has the source portion 52 connected to the drain portion 57 of the first current source 43 via a via 67 and the metal line 59. As above, the amplification transistor 42 and the first current source 43 constitute the source follower circuit 41.

The D/A conversion circuit output unit 15 has, as a load thereof, the comparison circuits 16 equal to the number of the columns, and a parasitic capacitance and a parasitic resistance of a long line that is a horizontally extending line from the D/A conversion circuit output unit 15 to the comparison circuits 16. To drive a such load, the D/A conversion circuit output unit 15 is provided with the source follower circuit 41 as the final stage buffer circuit that outputs the comparison potential $V_{RAMP}$.

Here, the inventors have found the possibility that the noise generated by the amplification transistor 42 in the source follower circuit 41 is a cause of producing a random fluctuation to the comparison potential $V_{RAMP}$ to significantly degrade the image quality of the solid-state imaging device 1.

A method for using a thin-film transistor as the amplification transistor 42 is conceivable as a method for reducing random noise generated by the amplification transistor 42 of the source follower circuit 41. However, if the thin-film transistor is used as the amplification transistor 42, it is likely to bring in a new problem such as gate oxide breakdown and source/drain junction breakdown of the thin-film transistor.

In view of this, as illustrated in FIG. 4 and FIG. 5, the solid-state imaging device 1 according to this embodiment includes the voltage control circuit 44 inserted between the gate and the drain of the amplification transistor 42. In other words, the solid-state imaging device 1 according to this embodiment includes the D/A conversion circuit output unit 15 provided in the common line 14 for providing the comparison potential $V_{RAMP}$ from the D/A conversion circuit 13 to the comparison circuit 16 in each column. The D/A conversion circuit output unit 15 includes: the source follower circuit 41 that is provided in the line 14 and includes the first current source 43 having a transistor, and the amplification transistor 42 having a gate oxide film thinner than a gate oxide film of the transistor of the first current source 43; and the voltage control circuit 44 that controls a drain-to-source voltage of the amplification transistor 42.

With this, it is possible to prevent the gate oxide breakdown and the source/drain junction breakdown of the amplification transistor 42, and to reduce the degradation of the image quality resulting from the horizontally linear random noise. The following describes the details of the effect.

First, the voltage control circuit 44 maintains a gate-to-drain voltage $V_{GD}$ of the amplification transistor 42 at a constant potential difference $V_{THP}$.

Here, if a constant voltage is applied to the drain terminal of the amplification transistor 42, a drain voltage $V_D$ is always constant in the source follower circuit 41 used as the buffer, while a comparison potential $V_{RAMP}$ that the D/A conversion circuit 13 inputs to the gate terminal of the amplification terminal 42 is not constant. To put it another way, a gate voltage $V_G$ of the amplification transistor 42 is not constant, and thus the gate-to-drain voltage $V_{GD}$ is not also the constant potential difference.

It is to be noted that in the Description, the constant potential difference means that the gate-to-drain voltage $V_{GD} = (V_D - V_G)$ is always kept constant regardless of the comparison potential $V_{RAMP}$ inputted to $V_G$.

In view of the above, the solid-state imaging device 1 according to this embodiment causes the voltage control circuit 44 to control the gate-to-drain voltage $(V_D - V_G)$ so that the following relationship is maintained.

Specifically, the voltage control circuit 44 performs the control to maintain a potential relationship $V_G + V_{THP} = V_D$ in which the drain voltage $V_D$ of the amplification transistor 42 is shifted by a threshold value $V_{THP}$ of the voltage control transistor 45 relative to the gate voltage $V_G$ of the amplification transistor 42.

With this, it is possible to reduce a row-by-row random fluctuation in image data resulting from the random fluctuation of the comparison potential $V_{RAMP}$, that is, the solid-state imaging device is capable of reducing the horizontally linear random noise, which is particularly emphasized because the human eye is sensitive to recognition of patterns in vertical and horizontal directions and a temporal fluctuation in image recognition.

Here, the threshold value $V_{THP}$ of the voltage control transistor 45 is less than or equal to a withstand voltage of the gate-to-drain voltage of the amplification transistor 42. With this, it is possible to prevent the gate oxide breakdown and the drain/source junction damage of the amplification transistor 42.

Moreover, by inserting the voltage control circuit 44 between the gate and the drain of the amplification transistor 42 of the source follower circuit 41, a drain-to-source voltage $V_{DS}$ of the amplification transistor 42 is always maintained at the constant potential difference $V_{THP}$. Stated differently, the voltage control circuit 44 is inserted between the drain terminal of the amplification transistor 42 and the power source, and controls the drain-to-source voltage of the amplification transistor 42 by controlling the drain voltage of the amplification transistor 42 so that the gate-to-drain voltage $(V_D - V_G)$ of the amplification transistor 42 is the threshold value $V_{THP}$ of the voltage control transistor 45. As a result, the drain-to-source voltage of the amplification transistor 42 is the constant potential difference $V_{THP}$.

Thus, it is possible to suppress linear degradation associated with a channel length modulation effect of the amplification transistor in input-output characteristics of the D/A conversion circuit output unit 15.

Let I represent a drain current, μ represent a carrier mobility, $C_{OX}$ represent a gate oxide film capacity per unit area, W represent a gate width, L represent a gate length, and $V_T$ represent a threshold voltage in the amplification transistor 42, a relation of (Equation 1) below holds. A given potential generated in the D/A conversion circuit 13 is applied to the gate of the amplification transistor 42 of the source follower circuit 41, an input voltage is shifted by a voltage indicated by (Equation 2) below, and the input voltage is outputted from the source terminal of the amplification transistor 42 which is an output terminal of the source follower circuit 41,

[Math. 1]

$$\beta = \mu C_{OX} \times \frac{W}{L} \quad \text{(Equation 1)}$$

[Math. 2]

$$\sqrt{2I/\beta} + V_T \quad \text{(Equation 2)}$$

The D/A conversion circuit output unit 15 is capable of satisfying a withstand voltage of (Equation 2) above by maintaining, between the drain terminal voltage $V_D$ of the amplification transistor 42 and the gate voltage $V_G$ of the same, a relation of (Equation 3) below to allow (i) a voltage at each of the four terminals of the amplifier transistor 42 to satisfy a prescribed withstand voltage and (ii) a voltage constraint against a film thickness to be reduced.

[Math. 3]

$$V_G + V_{THP} = V_D \quad \text{(Equation 3)}$$

The following describes the details of a random noise reduction effect produced by the D/A conversion circuit output unit 15 using the amplification transistor 42. Here, the random noise reduction effect of the D/A conversion circuit output unit 15 according to this embodiment is described using a comparative example. Although a D/A conversion circuit output unit in the comparative example is substantially the same as the D/A conversion circuit output unit 15, the D/A conversion circuit output unit includes a transistor of which the gate oxide film has a gate oxide film thickness $t_{ox2}$ instead of the amplification transistor 42 of which the gate oxide film has a gate oxide film thickness $t_{ox1}$. The gate oxide film thickness $t_{ox2}$ is equal to that of the transistor of the first current source 43.

Let $t_{ox1}$ represent the gate oxide film thickness of the amplification transistor 42 according to this embodiment, $N_1$ represent random noise generated in the amplification transistor 42, $t_{ox2}$ represent the gate oxide film thickness of the transistor in the comparative example, and $N_2$ represent random noise generated in the transistor, a relation of (Equation 4) below holds,

[Math. 4]

$$N_1 = N_2 \times \frac{1}{\sqrt{t_{OX2}/t_{OX1}}} \quad \text{(Equation 4)}$$

Here, a relation of (Equation 5) below holds between a film thickness of a gate oxide film 61 of the amplification transistor 42 according to this embodiment and the film thickness of the gate oxide film of the transistor in the comparative example.

[Math. 5]

$$T_{OX1} < t_{OX2} \quad \text{(Equation 5)}$$

In other words, the film thickness $t_{ox1}$ of the gate oxide film 61 of the amplification transistor 42 according to this embodiment is less than the film thickness $t_{ox2}$ of the gate oxide film of the transistor of the first current source 43.

Thus, from (Equation 4) and (Equation 5) above, a relation of (Equation 6) below holds for random noise $N_1$ generated in the amplification transistor 42 having the gate oxide film thickness $t_{ox1}$ relative to random noise $N_2$ generated in the transistor having the gate oxide film thickness $t_{ox2}$.

[Math. 6]

$$N_1 < N_2 \quad \text{(Equation 6)}$$

To put another way, compared to a source follower circuit including the transistor of which the gate oxide film thickness is the same as that of the transistor of the first current source 43 as in the comparative example, the source follower circuit 41 including the amplification transistor 42 that is the transistor having the thinner gate oxide film than the transistor of the first current source 43 as in this embodiment is capable of reducing the random noise.

Stated differently, using the amplification transistor 42 including the thin-film transistor for the D/A conversion circuit output unit 15 leads to reduce the random noise generated in the D/A conversion circuit output unit 15, and satisfactory image data having less horizontally linear random noise can be obtained accordingly.

As described above, the solid-state imaging device 1 according to this embodiment includes: the pixels 11 which are arranged in rows and columns on the same semiconductor substrate 10 and each of which generates a pixel signal according to an amount of received light; the comparison circuit 16 that is connected in common to the pixels in each column and compares the pixel signal to the comparison potential $V_{RAMP}$ that is a comparison criterion; the D/A conversion circuit 13 that generates the comparison potential $V_{RAMP}$ and provides the comparison potential $V_{RAMP}$ in common to the comparison circuit 16 in each column; and the D/A conversion circuit output unit 15 provided in the common line 14 for providing the comparison potential $V_{RAMP}$ from the D/A conversion circuit 13 to the comparison circuit 16 in each column, wherein the D/A conversion circuit output unit 15 includes: the source follower circuit 41 that is provided in the line 14 and includes: the first current source 43 having the transistor; and the amplification transistor 42 that is the transistor having the thinner gate oxide film than the transistor; and the voltage control circuit 44 that controls the drain-to-source voltage of the amplification transistor 42. It is to be noted that the D/A conversion circuit 13 corresponds to a comparison signal generating unit, the D/A conversion circuit output unit 15 corresponds to a signal conditioning circuit provided in a common signal path for providing the comparison potential $V_{RAMP}$ from the D/A conversion circuit 13 to the comparison circuit 16 in each column, and the line 14 corresponds to the signal path.

As above, by causing the film thickness $t_{ox1}$ of the gate oxide film of the amplification transistor 42 to be less than the film thickness $t_{ox2}$ of the gate oxide film of the transistor of the first current source 43, the random noise generated in the source follower circuit 41 can be reduced, and thus the random noise of the comparison potential $V_{RAMP}$ to be inputted to the comparison circuit 16 in each column can be reduced. As a result, it is possible to reduce the noise that results from the random noise of the comparison potential $V_{RAMP}$ and causes the uniform errors in the results of the digital conversion performed for all the columns.

In other words, the solid-state imaging device 1 according to this embodiment is capable of reducing the random noise that appears as horizontal lines in the image obtained from the output signal outputted from the solid-state imaging device 1.

Moreover, by inserting the voltage control circuit 44 between the gate and the drain of the amplification transistor 42 of the source follower circuit 41 as the D/A conversion circuit output unit 15, the withstand voltage among the four terminals of the amplification transistor 42 can be satisfied in the source follower circuit 41.

It is to be noted that in this embodiment, the voltage control circuit 44 may include two transistors as a basic configuration. To put it another way, the second current source 46 may include a transistor.

With this, it is possible to achieve the prevention of the gate oxide breakdown and the drain/source junction damage with the solid-state imaging device 1 miniaturized, and to reduce the random noise (horizontally linear random noise) superimposed on the comparison potential $V_{RAMP}$ to be applied to the line 14 connected to the comparison circuit 16 provided in each column in a MOS image sensor circuit of a column parallel A/D conversion type.

Embodiment 2

A solid-state imaging device according to Embodiment 2 is substantially the same as the solid-state imaging device 1 according to Embodiment 1, but differs from the solid-state imaging device 1 in a configuration of a voltage control circuit.

The following describes the solid-state imaging device according to this embodiment with reference to the drawings, focusing on the difference from Embodiment 1.

Figure 7:
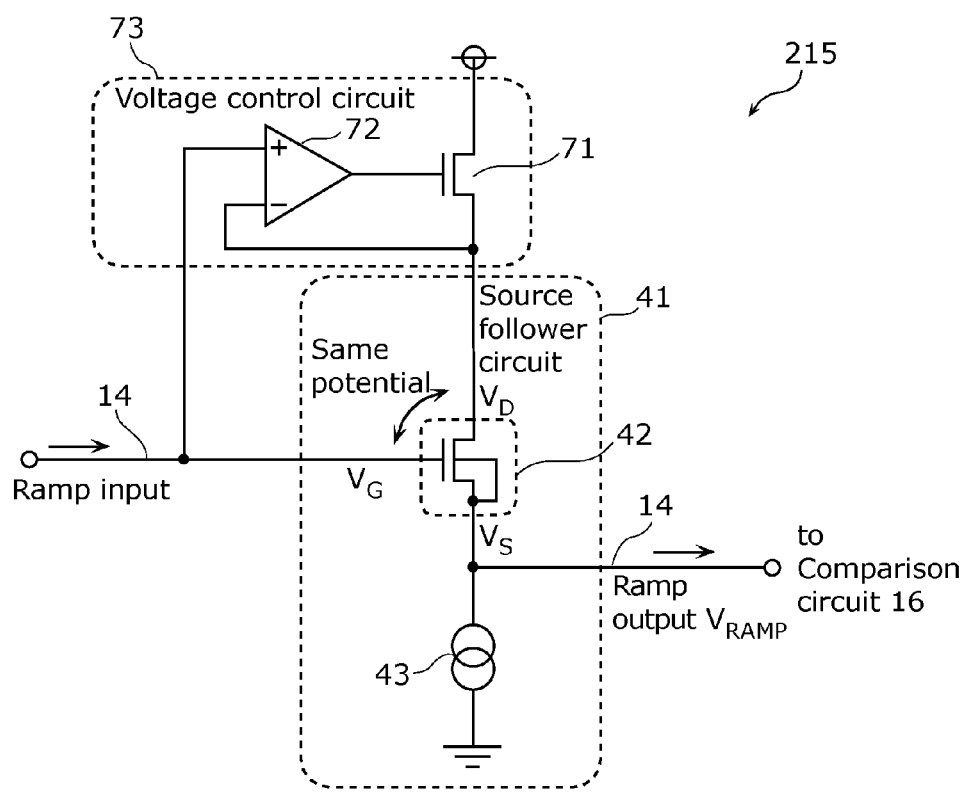
FIG. 7 is a circuit diagram illustrating a configuration of a D/A conversion circuit output unit in a solid-state imaging device according to Embodiment 2.

FIG. 7 is a circuit diagram illustrating a configuration of a D/A conversion circuit output unit 215 in the solid-state imaging device according to this embodiment.

As illustrated in FIG. 7, the D/A conversion circuit output unit 215 according to this embodiment has the configuration of the source follower circuit 41 to which the comparison potential $V_{RAMP}$ generated by the D/A conversion circuit 13 (FIG. 1) is inputted, and the source follower circuit 41 includes the amplification transistor 42 and the first current source 43.

Moreover, to keep constant the gate-to-drain voltage $V_{GD}$ of the amplification transistor 42 of the source follower circuit 41 regardless of the input voltage to the source follower circuit 41, the D/A conversion circuit output unit 215 includes a voltage control circuit (a feedback circuit) 73 including a voltage regulating transistor 71 that is inserted between the drain terminal of the amplification transistor 42 and a power source, and an operational amplifier 71.

In other words, the D/A conversion circuit output unit 215 according to this embodiment differs from the D/A conversion circuit output unit 15 according to Embodiment 1 in including the voltage control circuit 73 instead of the voltage control circuit 44.

Specifically, the voltage control circuit 73 includes: the voltage regulating transistor 71 that is inserted between the drain terminal of the amplification transistor 42 and the power source; and the operational amplifier 72 having one of input terminals connected to the gate terminal of the amplification transistor 42, the other of the input terminals connected to the drain terminal of the amplification transistor 42, and an output terminal connected to a gate terminal of the voltage regulating transistor 71. To put it another way, the voltage control circuit 73 is the feedback circuit.

Here, like Embodiment 1, the amplification transistor 42 is the thin-film transistor having the structure in which the gate oxide film is thinner than the gate oxide films of the other transistors.

The operational amplifier 72 has an inverting input terminal connected to the drain terminal of the amplification transistor 42 and a non-inverting input terminal connected to the gate terminal of the amplification transistor 42, and operates to equalize a voltage of the non-inverting input terminal and a voltage of the inverting input terminal.

With this, the voltage control circuit 73, the feedback circuit, always fixes, to the same potential $V_G=V_D$, a drain voltage $V_D$ of the amplification transistor 42 and a gate voltage $V_G$ to which the comparison potential $V_{RAMP}$ is inputted, thereby allowing the gate-to-drain voltage $V_{GD}$ of the amplification transistor 42 to be always $V_{GD}=0$ regardless of the comparison potential $V_{RAMP}$ inputted to $V_G$.

Moreover, the voltage control circuit 73, the feedback circuit using the operational amplifier 72, allows the gate voltage $V_G$ and the drain terminal voltage $V_D$ of the amplification transistor 42 to be in the potential relation $V_G=V_D$. Thus, compared to the D/A conversion circuit output unit 15 according to Embodiment 1, the D/A conversion circuit output unit 215 is capable of further enhancing linearity of input-output characteristics.

With this, like the solid-state imaging device 1 according to Embodiment 1, the solid-state imaging device according to this embodiment is capable of reducing the horizontally linear random noise, and further reducing, when generating an image by converting an amount of light into digital signals with reference to the comparison potential $V_{RAMP}$ outputted from the D/A conversion circuit 13, image characteristic degradation such as a standout of an image of a subject captured in the dark and gamma characteristic degradation which is caused by non-linearity of the D/A conversion circuit output unit 215.

Embodiment 3

Figure 8A:
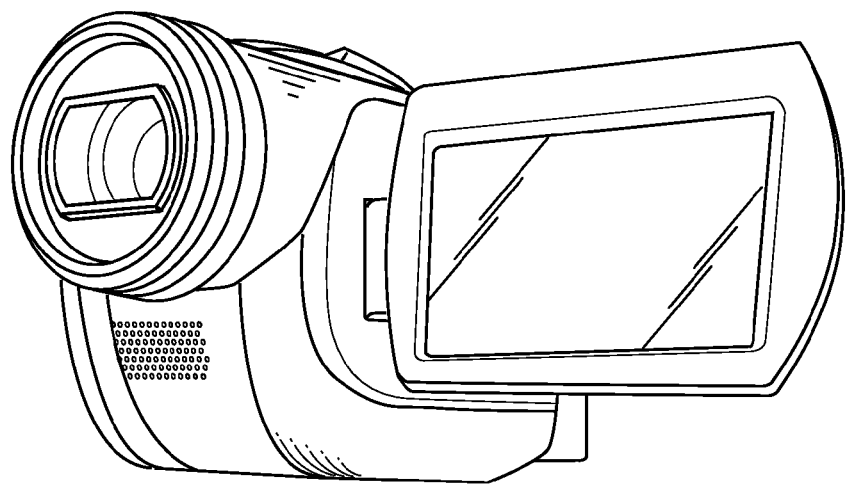
FIG. 8A is an external view illustrating an exemplary video camera.
Figure 8B:
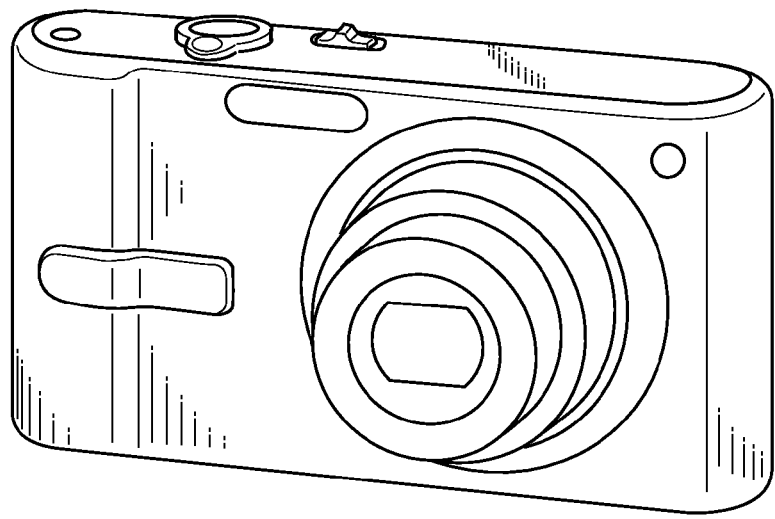
FIG. 8B is an external view illustrating an exemplary digital still camera.

The solid-state imaging devices according to Embodiments 1 and 2 are suitable for use as an imaging device (an image input device) in a video camera illustrated in FIG. 8A, a digital still camera illustrated in FIG. 8B, and additionally an image capturing apparatus such as a camera module for a mobile device like a cellular phone.

Figure 9:
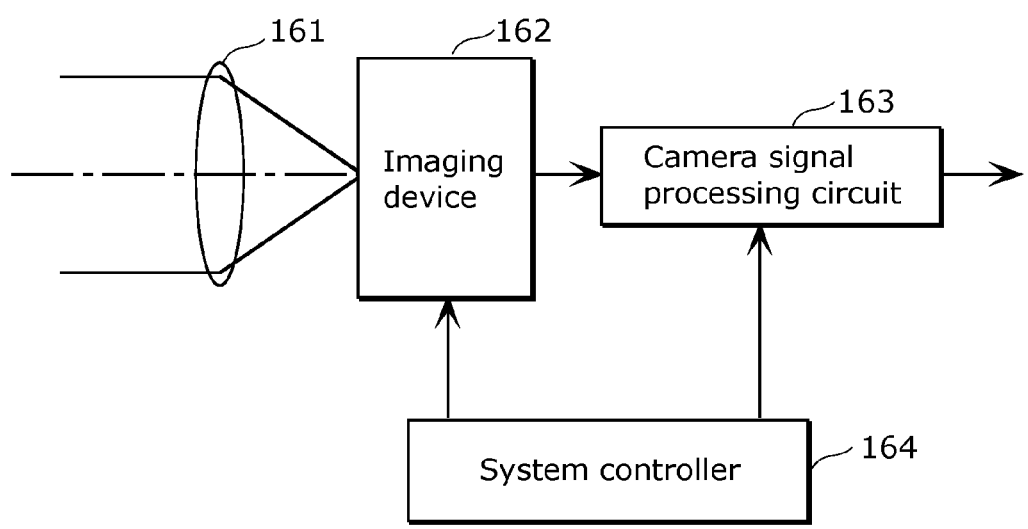
FIG. 9 is a block diagram illustrating an exemplary configuration of an image capturing apparatus according to Embodiment 3.
Figure 10:
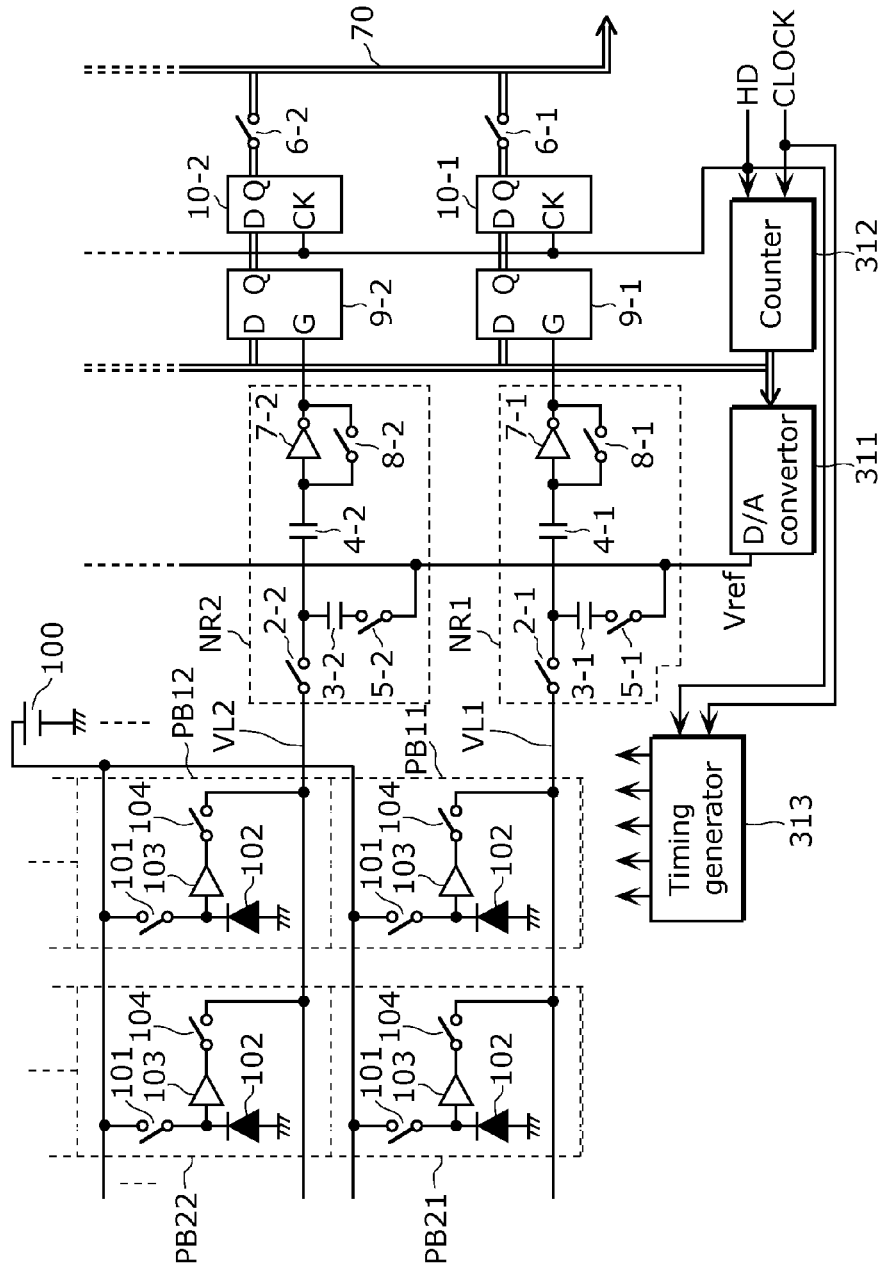
FIG. 10 is a block diagram illustrating a configuration of a conventional solid-state imaging device.

FIG. 9 is a block diagram illustrating an exemplary configuration of an image capturing apparatus according to Embodiment 3. As illustrated in FIG. 9, the image capturing apparatus according to this embodiment includes an optical system including a lens 161, an imaging device 162, a camera signal processing circuit 163, a system controller 164, and so on. The lens 161 forms, from image light from a subject, an image on an imaging area of the imaging device 162. The imaging device 162 outputs an image signal obtained by converting, on a pixel-by-pixel basis, the image light, from which the lens 161 formed the image on the imaging area, into an electrical signal. The solid-state imaging devices according to Embodiments 1 and 2 are used as the imaging device 162.

The camera signal processing circuit 163 performs various signal processing on the image signal outputted from the imaging device 162. The system controller 164 controls the imaging device 162 and the camera signal processing circuit 163.

As described above, the image capturing apparatus according to this embodiment includes the imaging device 162 capable of reducing the degradation of the image quality by suppressing the horizontally linear random noise.

Other Configurations

The solid-state imaging devices according to the embodiments described above with reference to the drawings may be enhanced and modified in various manners, without departing from the spirit of the present disclosure.

For instance, it goes without saying that the pixel 11 may have a structure including the transfer transistor 22, the floating diffusion (FD) unit 23, the reset transistor 25, and the amplification transistor 26, that is, the one-pixel one-cell structure, or may have a structure which includes pixels and in which any or all of the FD unit 23, the reset transistor 25, and the amplification transistor 26 are shared in the pixel 11, that is, the pixel sharing structure. In addition, although the pixel array and the column current source load 28 use an NMOS transistor, the pixel array and the column current source load 28 may use a PMOS transistor depending on a substrate type or a photo diode configuration.

Moreover, although the source follower circuit included in the D/A conversion circuit output unit includes the NMOS transistor in the present disclosure, the source follower circuit may include the PMOS transistor according to an input-output voltage range.

Furthermore, although a substrate terminal of the amplification transistor in the source follower circuit is connected to the source terminal that is an output for suppressing the substrate bias effect, a substrate terminal may be connected to a ground potential terminal in the case of an NMOS source follower circuit, and a substrate terminal may be connected to a power source terminal in the case of a PMOS source follower circuit.

Moreover, although the column parallel A/D conversion of a comparison potential reference type has been described thus far, column A/D conversion (e.g., A/D conversion of a sequential comparison type) of a type used by providing the comparison potential to all the columns in the same manner produces the same effect.

Furthermore, the voltage control circuit 44 controls the drain voltage of the amplification transistor 42 so that the gate-to-drain voltage of the amplification transistor 42 is the constant potential difference $V_{THP}$ in Embodiment 1, and the voltage control circuit 73 controls the drain voltage of the amplification transistor 42 so that the gate-to-drain voltage of the amplification transistor 42 is 0 V. However, the gate-to-drain voltage is not limited to these, and may be less than or equal to a withstand voltage of the gate-to-drain voltage of the amplification transistor 42.

It is to be noted that the solid-state imaging device according to the present disclosure is not limited to the above-described embodiments. The present disclosure includes other embodiments achieved by combining any of the structural elements in each of the embodiments, modifications obtained by making, to each embodiment, various alterations conceived by a person skilled in the art without departing the spirit of the present disclosure, and various apparatuses including the solid-state imaging device according to the present disclosure.

Moreover, the circuit configuration illustrated in the circuit diagram is an example, and the present disclosure is not limited to the circuit configuration. In other words, the present disclosure includes a circuit that is capable of achieving the characteristic functions of the present disclosure in the same manner as the circuit configuration. For example, the present disclosure includes a configuration in which an element such as a transistor, a resistance element, and a capacitative element is connected in series or parallel to another element to the extent that the same functions as those of the circuit configuration can be achieved. To put it another way, the term "connected" in the embodiments is not limited to a case where two terminals (nodes) are directly connected, and includes a case where the two terminals (nodes) are connected via an element to the extent that the same functions can be achieved.

INDUSTRIAL APPLICABILITY

The present disclosure can be applied to a solid-state imaging device and an image capturing apparatus, and particularly to a digital video camera, a digital still camera, a cellular phone, and so on for which high image quality is required.

The invention claimed is:

1. A solid-state imaging device comprising:
 a plurality of pixels which are arranged in rows and columns on a same semiconductor substrate and each of which generates a pixel signal according to an amount of received light;
 a comparison circuit that is connected in common to the pixels in each of the columns and compares the pixel signal to a comparison signal that is a comparison criterion;
 a comparison signal generating unit configured to generate the comparison signal and provide the comparison signal in common to the comparison circuit in each column; and
 a signal conditioning circuit provided in a common signal path for providing the comparison signal from the comparison signal generating unit to the comparison circuit in each column,
 wherein the signal conditioning circuit includes:
 a source follower circuit that is provided to the signal path and includes a first current source having a transistor, and an amplification transistor having a gate oxide film that is thinner than a gate oxide film of the transistor; and
 a voltage control circuit that controls a drain-to-source voltage of the amplification transistor.

2. The solid-state imaging device according to claim 1, wherein the voltage control circuit is inserted between a drain terminal of the amplification transistor and a power source, and controls the drain-to-source voltage of the amplification transistor by controlling a drain voltage of the amplification transistor so that a gate-to-drain voltage of the amplification transistor is a predetermined voltage.

3. The solid-state imaging device according to claim 2, wherein the predetermined voltage is less than or equal to a withstand voltage of the gate-to-drain voltage of the amplification transistor.

4. The solid-state imaging device according to claim 1, wherein the voltage control circuit includes:
 a voltage regulating transistor inserted between a drain terminal of the amplification transistor and a power source; and
 an operational amplifier having one of input terminals connected to a gate terminal of the amplification transistor, the other of the input terminals connected to the drain terminal of the amplification transistor, and an output terminal connected to a gate terminal of the voltage regulating transistor.

5. The solid-state imaging device according to claim 1, wherein the voltage control circuit includes:
 a voltage control transistor having a gate terminal connected to a gate terminal of the amplification transistor, and a source terminal connected to a drain terminal of the amplification transistor; and
 a second current source that is a current source of the voltage control transistor.

6. An image capturing apparatus comprising the solid-state imaging device according to claim 1.

* * * * *